(12) United States Patent
Tsai et al.

(10) Patent No.: US 12,327,715 B2
(45) Date of Patent: Jun. 10, 2025

(54) SEMICONDUCTOR TOOL FOR COPPER DEPOSITION

(71) Applicant: Taiwan Semiconductor Manufacturing Company, Ltd., Hsinchu (TW)

(72) Inventors: Chia-Hung Tsai, Hsinchu County (TW); Chin-Szu Lee, Taoyuan (TW); Szu-Hua Wu, Zhubei (TW); Jui-Hung Ho, Hsinchu (TW); Chi-Hung Liao, Hsinchu (TW); Yu-Jen Chien, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 17/651,272

(22) Filed: Feb. 16, 2022

(65) Prior Publication Data
US 2023/0260770 A1    Aug. 17, 2023

(51) Int. Cl.
*H01L 21/285*     (2006.01)
*C23C 14/35*     (2006.01)
(Continued)

(52) U.S. Cl.
CPC .......... *H01J 37/3488* (2013.01); *C23C 14/35* (2013.01); *C23C 14/54* (2013.01);
(Continued)

(58) Field of Classification Search
CPC ............... H01J 37/3488; H01J 37/3447; H01J 37/3452; H01J 37/3476; H01J 37/3405;
(Continued)

(56) References Cited

U.S. PATENT DOCUMENTS

| 6,132,566 A | * | 10/2000 | Hofmann | ............... C23C 14/358 |
| | | | | 204/192.15 |
| 6,605,197 B1 | * | 8/2003 | Ding | ................. H01L 21/76877 |
| | | | | 204/192.15 |

(Continued)

FOREIGN PATENT DOCUMENTS

| JP | 2002047566 A | 2/2002 |
| TW | 201629247 A | 8/2016 |

(Continued)

*Primary Examiner* — James Lin
*Assistant Examiner* — Patrick S Ott
(74) *Attorney, Agent, or Firm* — Harrity & Harrity, LLP

(57) ABSTRACT

A magnetic shield reduces external noise in a chamber including a target and at least one electromagnet for copper physical vapor deposition (PVD). The shield may have a thickness in a range from approximately 0.1 mm to approximately 10 mm to provide sufficient protection from radio frequency and other electromagnetic signals. As a result, copper atoms in the chamber undergo less re-direction from external noise. Additionally, even when hardware failure occurs during PVD (e.g., an electromagnet malfunctions, a wafer stage is not level, and/or a flow optimizer induces too much shift, among other examples), the copper atoms are less susceptible to small re-directions from external noise. As a result, back end of line (BEOL) and/or middle end of line (MEOL) conductive structures are formed in a more uniform manner, which increases conductivity and improves lifetime of an electronic device including the BEOL and/or MEOL conductive structures.

20 Claims, 16 Drawing Sheets

(51) Int. Cl.
*C23C 14/54* (2006.01)
*H01J 37/34* (2006.01)
*H01L 21/768* (2006.01)
*H01L 23/532* (2006.01)
*H05K 9/00* (2006.01)

(52) U.S. Cl.
CPC ...... *H01J 37/3447* (2013.01); *H01J 37/3452* (2013.01); *H01J 37/3476* (2013.01); *H01L 21/2855* (2013.01); *H01L 21/76879* (2013.01); *H05K 9/0088* (2013.01); *H01L 23/53238* (2013.01)

(58) Field of Classification Search
CPC ... H01J 37/3408; H01J 37/3455; C23C 14/35; C23C 14/54; C23C 14/046; C23C 14/351; C23C 14/564; H01L 21/2855; H01L 21/76879; H01L 23/53238; H05K 9/0088
See application file for complete search history.

(56) References Cited

U.S. PATENT DOCUMENTS

| | | | |
|---|---|---|---|
| 11,043,454 B2 | 6/2021 | Hegde et al. | |
| 2004/0020770 A1* | 2/2004 | Wang | C23C 14/046 204/298.18 |
| 2005/0205209 A1* | 9/2005 | Mosden | H01L 21/67069 156/345.31 |
| 2006/0024451 A1* | 2/2006 | Mungkekar | H01J 37/321 118/719 |
| 2008/0149473 A1 | 6/2008 | Ajima | |
| 2013/0105086 A1* | 5/2013 | Banna | H01J 37/32174 315/111.41 |
| 2014/0262044 A1* | 9/2014 | Yousif | H01J 37/3266 118/723 R |
| 2015/0255339 A1* | 9/2015 | Zhang | H01L 21/76877 438/653 |
| 2016/0030909 A1* | 2/2016 | Detavernier | C23C 14/505 506/40 |
| 2016/0240357 A1* | 8/2016 | Chi | C23C 14/35 |
| 2018/0240655 A1* | 8/2018 | Wu | H01J 37/32651 |
| 2021/0073610 A1* | 3/2021 | Kuriki | G06N 3/08 |
| 2022/0350254 A1 | 11/2022 | Pisarenco et al. | |

FOREIGN PATENT DOCUMENTS

| | | |
|---|---|---|
| TW | 202109748 A | 3/2021 |
| TW | 202117454 A | 5/2021 |

\* cited by examiner

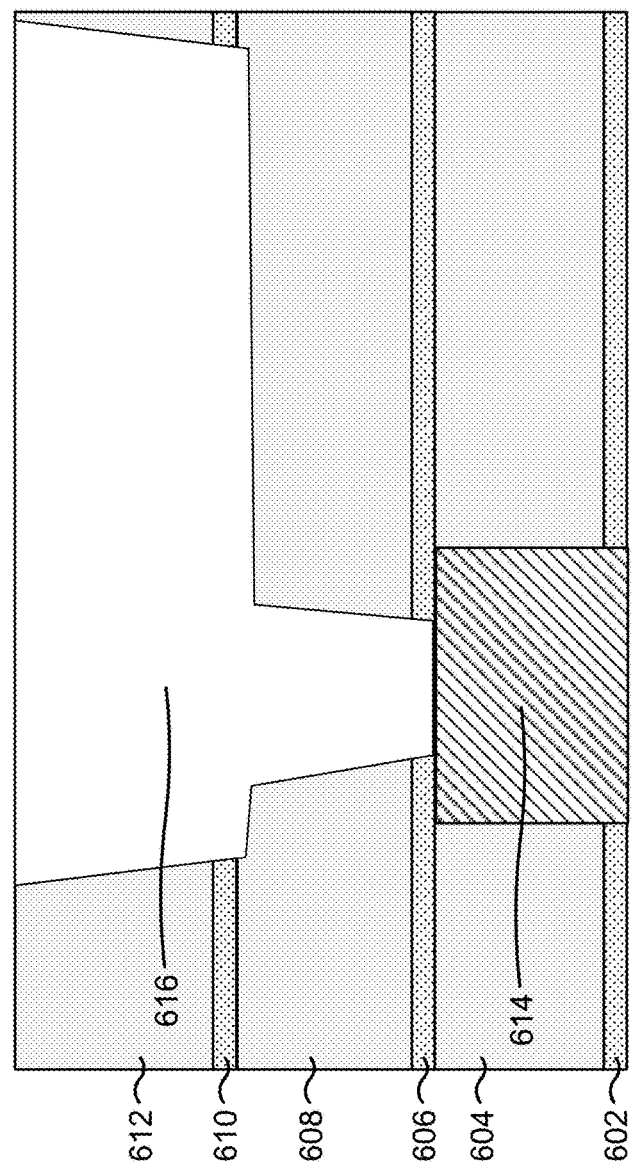

SEMICONDUCTOR TOOL FOR COPPER DEPOSITION

BACKGROUND

Some electronic devices, such as a processor, a memory device, or another type of electronic device, include a middle end of line (MEOL) region that electrically connects transistors in a front end of line (FEOL) region to a back end of line (BEOL) region. The BEOL region or MEOL region may include a dielectric layer and via plugs formed in the dielectric layer. A plug may include one or more metals for electrical connection. One or more materials of the BEOL region and/or the MEOL region may be deposited using physical vapor deposition (PVD).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 6A-6E are diagrams of an example copper deposition process performed in the copper deposition chamber described herein.

DETAILED DESCRIPTION

Figure 1:
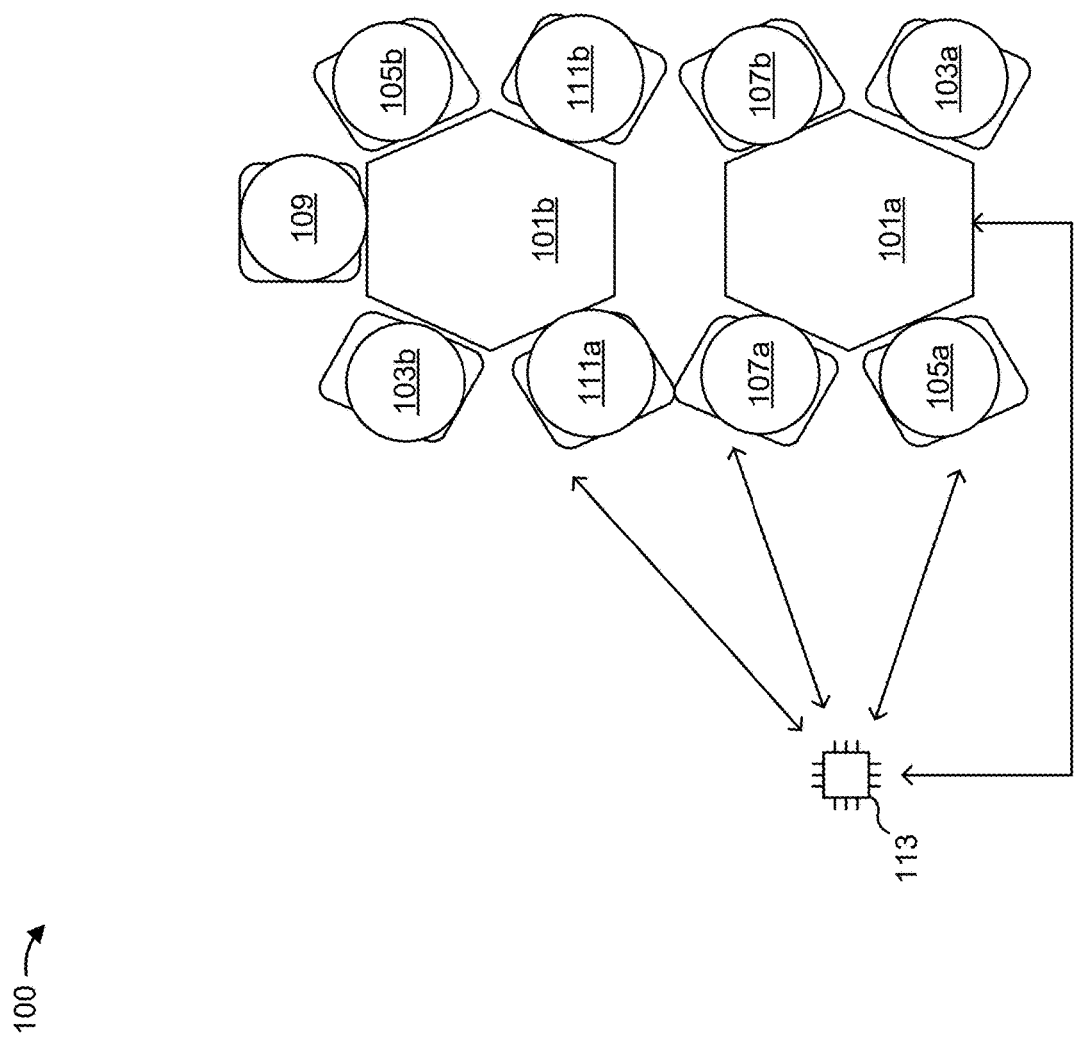
FIG. 1 is a diagram of an example semiconductor processing tool described herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Copper (Cu) is often used for back end of line (BEOL) metallization layers and vias (also referred to as M1, M2, or M3 interconnects or metallization layers) or for middle end of line (MEOL) contact plugs (also referred to as M0 interconnects or metallization layers) due to low contact resistance and sheet resistance relative to other conductive materials, such as aluminum (Al). Lower resistivity provides lower resistance/capacitance (RC) time constants and faster propagation of signals across an electronic device.

Copper can be deposited using physical vapor deposition (PVD). Electromagnets direct the vaporized copper atoms into recesses on a wafer. However, the copper atoms are readily subject to re-direction from external noise, such as radio frequency (RF) and electromagnetic (EM) radiation. Re-direction of copper atoms results in less uniform deposition. Additionally, when hardware failure occurs during PVD (e.g., an electromagnet malfunctions, a wafer stage is not level, and/or a flow optimizer induces too much shift), the copper atoms are even more susceptible to small re-directions from external noise. As a result, BEOL and/or MEOL conductive structures can be formed with gaps, which reduce conductivity and lifetime of an electronic device including the BEOL and/or MEOL conductive structures.

Some implementations described herein provide techniques and apparatuses for a magnetic shield to reduce external noise in a chamber including a target and at least one electromagnet for copper PVD. The shield may have a thickness in a range from approximately 0.1 millimeters (mm) to approximately 10 mm to provide sufficient protection from RF and other EM signals. As described herein, the shield may cover all of the chamber or a portion of the chamber (e.g., a portion adjacent to the at least one electromagnet). As a result, the magnetic shield reduces noise such that copper atoms undergo less re-direction from external noise. Additionally, even when hardware failure occurs during PVD (e.g., an electromagnet malfunctions, a wafer stage is not level, and/or a flow optimizer induces too much shift, among other examples), the copper atoms are less susceptible to small re-directions from external noise. As a result, BEOL and/or MEOL conductive structures are formed in a more uniform manner, which increases conductivity and improves lifetime of an electronic device including the BEOL and/or MEOL conductive structures.

FIG. 1 is a diagram of an example of a semiconductor processing environment 100 described herein. The environment 100 may be configured for use in a semiconductor foundry or a semiconductor fabrication facility, among other examples.

As shown in FIG. 1, the environment 100 includes one or more buffers, such as buffer 101a and buffer 101b. Buffers 101a and 101b may each include a sealed chamber that receives a wafer between processes performed by the environment 100. Buffers 101a and 101b may each maintain a vacuum environment.

Although described using two buffers, an alternative implementation includes a single buffer in order to conserve space, power, and hardware. Other alternative implementations include additional buffers (e.g., three buffers, four buffers, and so on) in order to further reduce chances of contamination of the wafer between processes.

In order to further prevent contamination of the wafer, the environment 100 may additionally include one or more transition chambers 103a and 103b. Similar to buffers 101a and 101b, the transition chambers 103a and 103b may each include a sealed chamber that receives the wafer between processes performed by the environment 100. Accordingly, the transition chambers 103a and 103b may each maintain a vacuum environment.

Although described using multiple transition chambers, an alternative implementation includes a single transition chamber in order to conserve space, power, and hardware. Other alternative implementations include additional transition chambers (e.g., three transition chambers, four transition chambers, and so on) in order to further reduce chances of contamination of the wafer between processes.

As further shown in FIG. 1, the environment 100 includes one or more cleaning chambers, such as chambers 105a and 105b. The chambers 105a and 105b may each include a sealed chamber that receives and processes the wafer. Accordingly, the chambers 105a and 105b may each maintain a vacuum environment. Chambers 105a and 105b may perform a cleaning process on the wafer. For example, a gas, such as hydrogen gas, argon gas, and/or helium gas, may be used to clean the wafer. Additionally, or alternatively, a plasma, such as hydrogen plasma, argon plasma, and/or helium plasma, may be used to clean the wafer. Accordingly, in one example, the chamber 105a may clean the wafer when the environment 100 initially receives the wafer, and the chamber 105b may clean the wafer between deposition processes.

The environment 100 may further include one or more deposition chambers, such as chambers 107a and 107b, that deposit target material on exposed dielectric surfaces on the wafer. For example, precursor materials may be received from an ampoule storage system and injected into the chamber. In some implementations, a precursor and a reaction gas may be received simultaneously such that the target material is grown using chemical vapor deposition (CVD). As an alternative, the precursor may be received and then a purge performed (e.g., using hydrogen gas, argon gas, and/or helium gas) before the reaction gas is received, such that the target material is grown using atomic layer deposition (ALD). The target material may include a barrier material (such as a nitride), a liner material (such as ruthenium, cobalt, and/or another metal), and/or another material used with an MEOL and/or BEOL conductive structure. In one example, the chamber 107a may deposit a barrier material in recesses on the wafer, and the chamber 107b may deposit a liner material in the recesses. For example, the barrier material may prevent migration of copper atoms and increase lifetime of an electronic device including the wafer, and the liner material may improve flow of copper into the recesses, as described below.

The environment 100 may further include one or more etching chambers, such as chamber 109, that perform etching on the wafer. For example, a plasma, such as hydrogen plasma, argon plasma, and/or helium plasma, may be used to etch material from the wafer. As an alternative, a polishing pad and slurry may be used to etch material using chemical-mechanical polishing (CMP). The etching may expose surfaces of the wafer such that target materials (e.g., barrier materials and/or liner materials) and/or conductive structures (e.g., MEOL and/or BEOL conductive structures) may be formed over the exposed surfaces. As an alternative, etching may remove photoresist material, dummy gates, and/or other material that is no longer needed on the wafer.

In one example, the chamber 109 may etch excess copper that flowed over the wafer, as described below.

As further shown in FIG. 1, the environment 100 includes one or more copper deposition chambers, such as chambers 111a and 111b. The copper deposition chambers 111a and 111b deposit copper in recesses on the wafer. For example, the copper deposition chambers 111a and 111b may each vaporize copper ions and direct the copper ions towards the wafer using at least one electromagnet (e.g., as described in connection with FIGS. 2A-2E). Accordingly, the copper deposition chambers 111a and 111b may deposit copper using PVD. The copper may be used to form MEOL and/or BEOL structures on the wafer. In some aspects, the copper may be deposited using two processes such that the copper deposition chambers 111a and 111b are both used to form the MEOL and/or BEOL structures.

Additionally, as shown in FIG. 1, the environment 100 may include a controller 113. Although depicted as a single processor to conserve power and space, the controller 113 may alternatively include a plurality of processors in order to increase processing power and reduce latency. The controller 113 may receive signals from sensors associated with the buffers 101a and 101b, the transition chambers 103a and 103b, the cleaning chambers 105a and 105b, the deposition chambers 107a and 107b, the etching chamber 109, and/or the copper deposition chambers 111a and 111b. For example, the controller 113 may receive signals associated with temperatures, pressures, and/or other environmental factors of the buffers, the transition chambers, the cleaning chambers, the deposition chambers, the etching chamber, and/or the copper deposition chambers. The controller 113 may transmit instructions to hardware associated with the buffers, the transition chambers, the cleaning chambers, the deposition chambers, the etching chamber, and/or the copper deposition chambers. For example, the controller 113 may transmit instructions to perform cleaning, deposition, and/or etching on the wafer. Although depicted as external, the controller 113 may additionally or alternatively include integrated circuits embedded in one or more other components of the environment 100 in order to conserve space.

During operation, the environment 100 includes noise from the chambers of the environment 100. For example, the chambers may include electric motors and/or other components that generate RF noise. Additionally, or alternatively, the chambers may include magnetic motors, electromagnets, and/or other components that generate EM noise. As a result, copper ions that are directed towards the wafer in copper deposition chambers 111a and 111b may be shifted due to the noise in the environment of the environment 100. Accordingly, rather than depositing to a uniform height across the wafer, the BEOL and/or MEOL conductive structures may be formed with air gaps. These air gaps reduce conductivity and lifetime of an electronic device including the BEOL and/or MEOL conductive structures.

Additionally, one or more hardware components of the copper deposition chambers 111a and 111b (e.g., as described in connection with FIGS. 2A-2E) may malfunction. However, any shift induced by the malfunction may be further exacerbated due to the noise in the environment 100. As a result, the wafer, which may still have been functional despite the malfunction in the copper deposition chambers 111a and 111b, may instead be rendered non-functional and thus wasted.

Accordingly, a magnetic shield (e.g., as described in connection with FIGS. 2A-2E, 3, 4, and 5) may be installed to reduce noise, from the environment 100, within the copper deposition chambers 111a and 111b. As a result, BEOL and/or MEOL conductive structures are formed in a more uniform manner, which increases conductivity and improves lifetime of an electronic device including the BEOL and/or MEOL conductive structures. Additionally, malfunctions in the copper deposition chambers 111a and 111b may result in fewer wasted wafers.

As indicated above, FIG. 1 is provided as an example. Other examples may differ from what is described with regard to FIG. 1. For example, certain devices and/or components of the environment 100 were not shown in FIG. 1 for ease of explanation. Additional devices and/or components relating to the environment 100 are described in connection with FIGS. 2A-2E, 3, 4, and 5.

FIGS. 2A-2E are diagrams of examples 200-240 of a copper deposition chamber within a semiconductor processing environment (e.g., environment 100 of FIG. 1). For example, the copper deposition chambers shown in FIGS. 2A-2E may be copper deposition chambers 111a and 111b of environment 100.

Figure 2A:
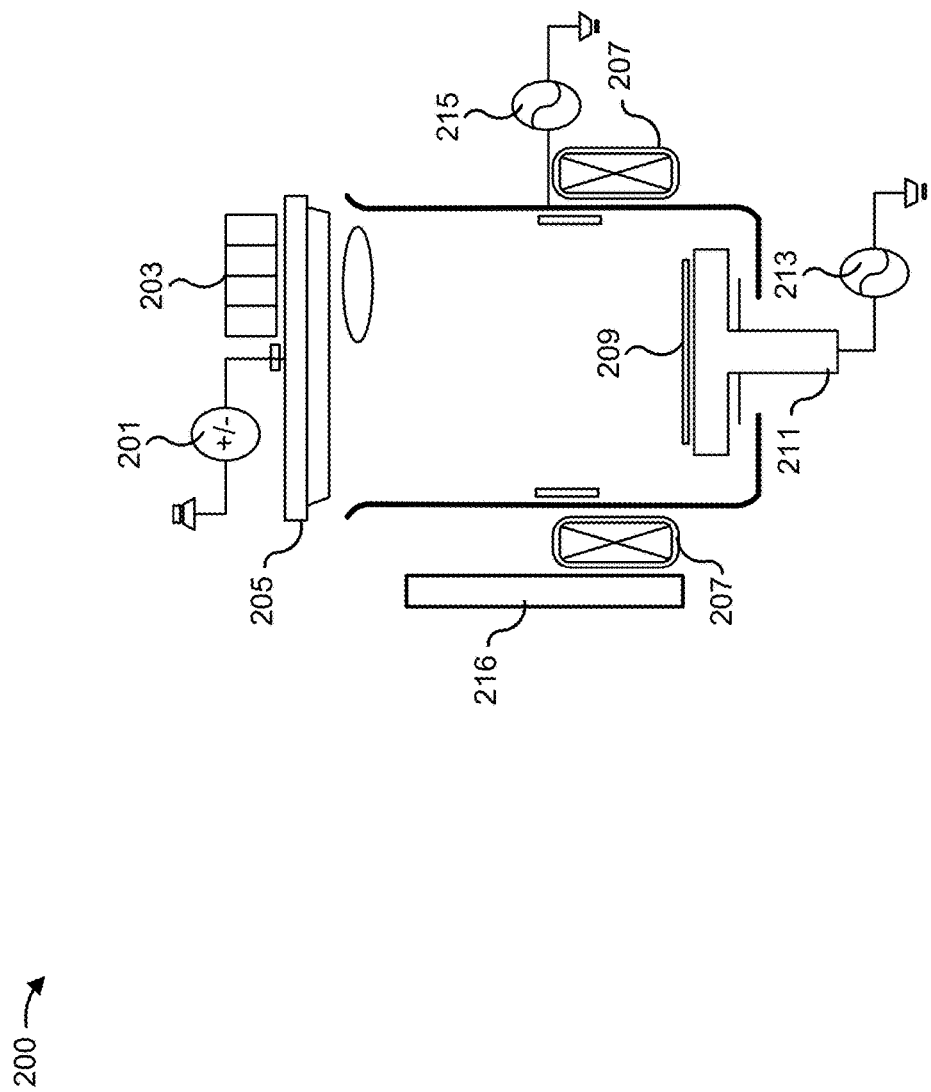
FIGS. 2A-2E are diagrams of an example copper deposition chamber described herein for use in the semiconductor processing tool of FIG. 1.

As shown in FIG. 2A, example 200 includes a power source 201 and a magnetic source 203 for vaporizing copper ions from a target 205. Accordingly, electromagnetic forces generated by the power source 201 and the magnetic source 203 cause vaporization of copper ions from the target 205. The target 205 may include a disc or other solid form of copper with a purity of at least 99%. By selecting a purity of at least 99%, impurities are not released that would contaminate the chamber and deposit on wafer 209, which can result in reduced conductivity or even non-functioning electronic devices formed on the wafer 209. In some implementations, and as described in connection with FIG. 4, the target 205 may be attached to a base. The base may be a stable element under the conditions generated by the power source 201 and the magnetic source 203, such as titanium (Ti). In some implementations, the base may additionally rotate to encourage copper ions to release from the target 205.

The copper ions may be directed from the target 205 to the wafer 209 using an electromagnet 207. The electromagnet 207 surrounds the chamber such that a cross-section of the electromagnet 207 is shown in FIG. 2A. As further shown in FIG. 2A, the wafer 209 may rest on a wafer stage 211. A power source 213 may power one or more motors (e.g., pneumatic motors, rotational motors, and/or other types of motors) that are configured to keep the wafer stage 211 level during deposition of copper on the wafer 209. Additionally, the power source 213 may power a heating element in the wafer stage 211 that warms the wafer 209 such that the copper ions flow into recesses on the wafer 209. For example, copper may accumulate in the recesses in order to form MEOL and/or BEOL conductive structures. In some implementations, an alternating current source 215 may additionally repel the copper ions from walls of the chamber. As a result, example 200 efficiently uses power to deposit copper on the wafer 209.

As further shown in FIG. 2A, example 200 may include a magnetic shield 216 to insulate the chamber from RF and EM noise. The magnetic shield 216 may be dimensioned and positioned as described in connection with FIGS. 3 and 4. By insulating the chamber from EM and RF noise, uniformity of copper deposition on a wafer in the chamber is improved. Accordingly, MEOL and/or BEOL structures may be formed with fewer, if any, air gaps.

Figure 2B:
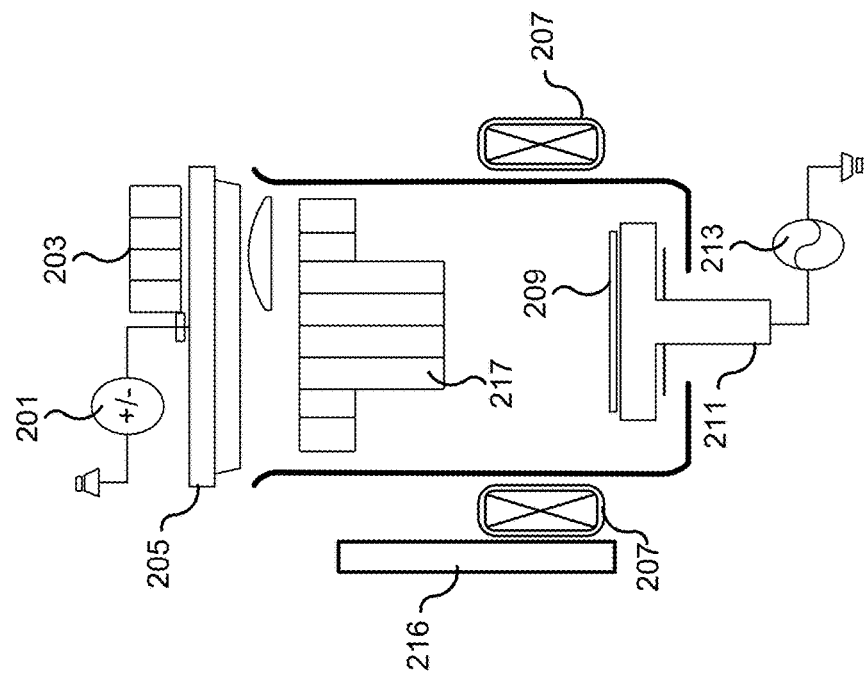

As shown in FIG. 2B, example 210 is similar to example 200. However, example 210 includes a collimator 217 configured to direct copper ions from the target 205 towards the wafer 209. The collimator 217 may include a plurality of slots configured to direct the copper ions in a plurality of directions towards the wafer 209. Accordingly, the collimator 217 may be used to direct the copper ions away from walls of the chamber in lieu of the alternating current source 215. As a result, example 210 increases accuracy with which copper is deposited on the wafer 209.

As further shown in FIG. 2B, example 210 may include a magnetic shield 216 to insulate the chamber from RF and EM noise. The magnetic shield 216 may be dimensioned and positioned as described in connection with FIGS. 3 and 4. By insulating the chamber from EM and RF noise, uniformity of copper deposition on a wafer in the chamber is improved. Accordingly, MEOL and/or BEOL structures may be formed with fewer, if any, air gaps.

Figure 2C:
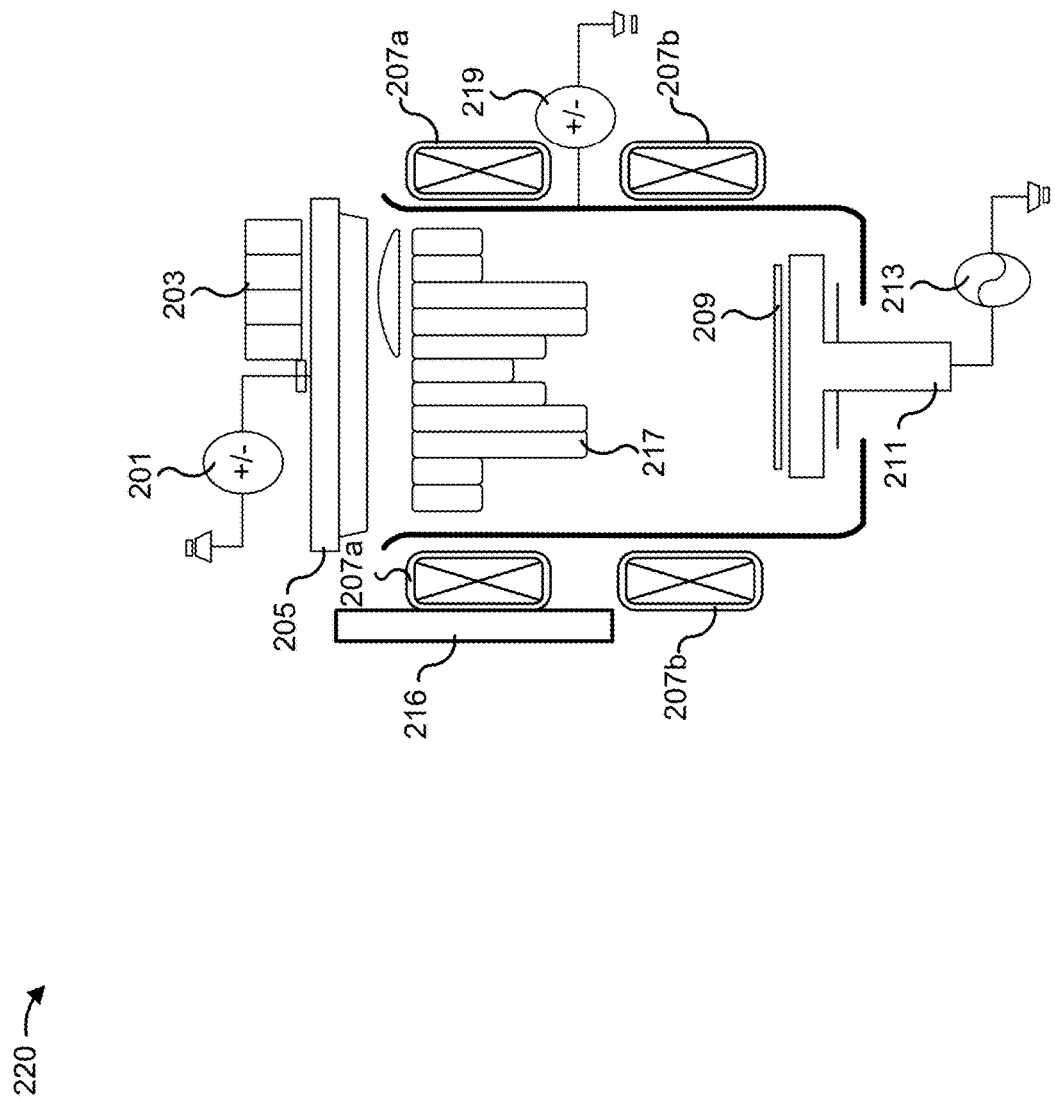

As shown in FIG. 2C, example 220 is similar to example 210. However, example 220 includes a power source 219 for the collimator 217. Accordingly, the collimator 217 may be an active collimator (e.g., including slots that have a non-zero voltage differential in order to repel copper ions towards a middle of each slot) rather than a passive collimator. Additionally, example 220 includes an upper electromagnet 207a and a lower electromagnet 207b. As a result, example 220 increases accuracy with which copper is deposited on the wafer 209.

As further shown in FIG. 2C, example 220 may include a magnetic shield 216 to insulate the chamber from RF and EM noise. The magnetic shield 216 may be dimensioned and positioned as described in connection with FIGS. 3 and 4. By insulating the chamber from EM and RF noise, uniformity of copper deposition on a wafer in the chamber is improved. Accordingly, MEOL and/or BEOL structures may be formed with fewer, if any, air gaps.

Figure 2D:
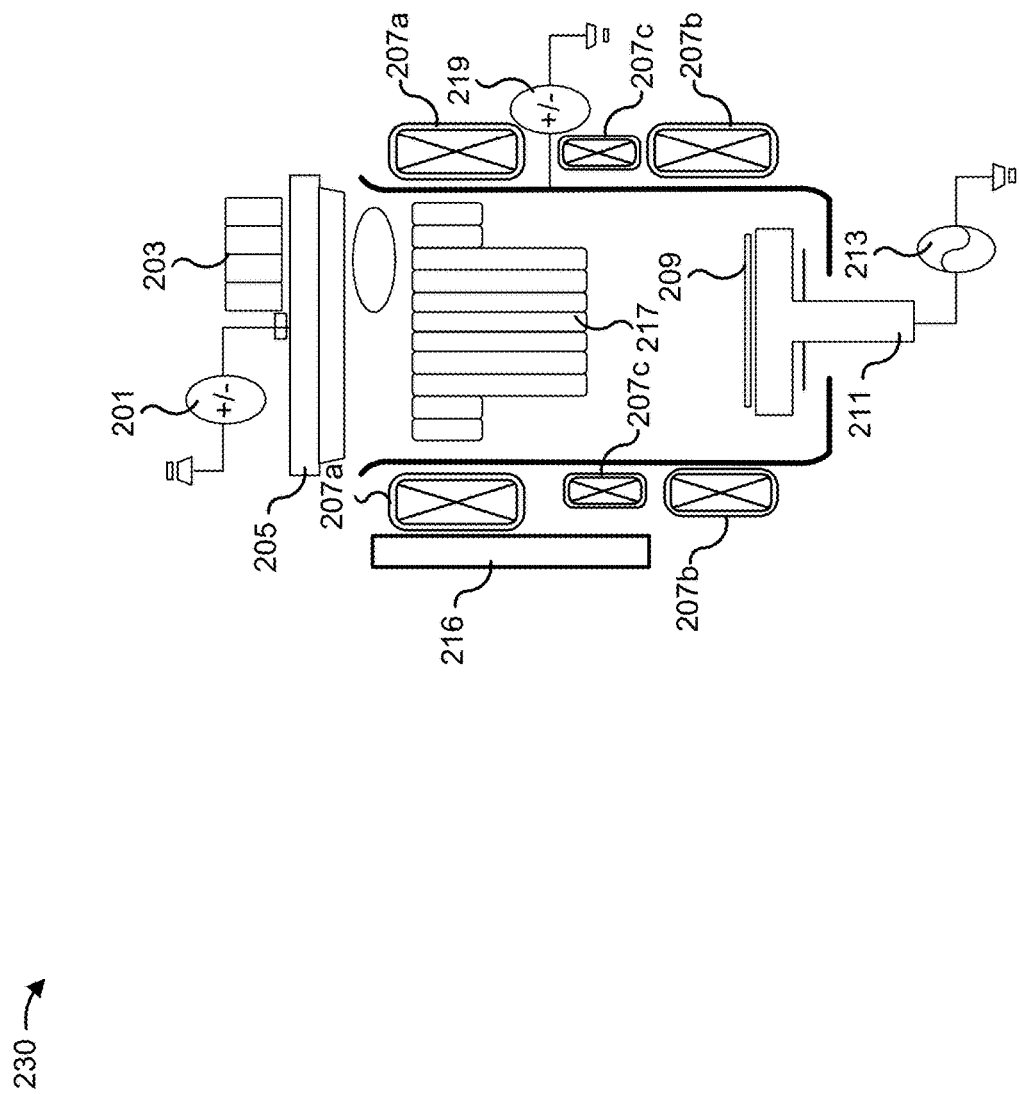

As shown in FIG. 2D, example 230 is similar to example 220. However, example 230 includes a middle electromagnet 207c as well as the upper electromagnet 207a and the lower electromagnet 207b. As a result, example 230 increases accuracy with which copper is deposited on the wafer 209.

As further shown in FIG. 2D, example 230 may include a magnetic shield 216 to insulate the chamber from RF and EM noise. The magnetic shield 216 may be dimensioned and positioned as described in connection with FIGS. 3 and 4. By insulating the chamber from EM and RF noise, uniformity of copper deposition on a wafer in the chamber is improved. Accordingly, MEOL and/or BEOL structures may be formed with fewer, if any, air gaps.

Figure 2E:
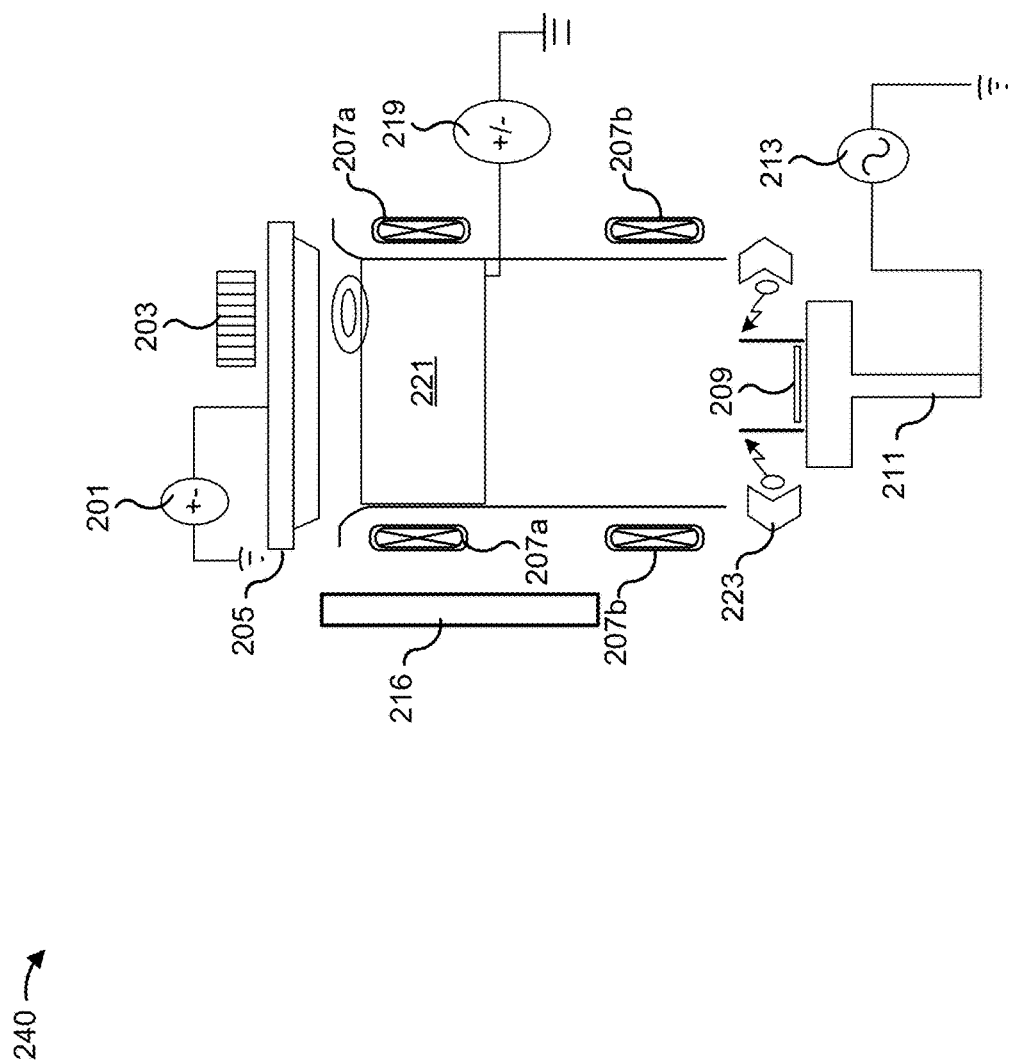

As shown in FIG. 2E, example 240 is similar to example 220. However, example 240 includes a flow optimizer 221 with smaller slots than in collimator 217. As a result, example 240 increases accuracy with which copper is deposited on the wafer 209. Additionally, example 240 uses the flow optimizer 221 in lieu of a middle electromagnet to improve power efficiency. Additionally, the wafer 209 is heated using lamp component 223 rather than a heating element included in the wafer stage 211. As a result, the wafer 209 may be heated more accurately and with greater power efficiency.

As further shown in FIG. 2E, example 240 may include a magnetic shield 216 to insulate the chamber from RF and EM noise. The magnetic shield 216 may be dimensioned and positioned as described in connection with FIGS. 3 and 4. By insulating the chamber from EM and RF noise, uniformity of copper deposition on a wafer in the chamber is improved. Accordingly, MEOL and/or BEOL structures may be formed with fewer, if any, air gaps.

Although described using the power source 201 and the magnetic source 203, examples 200, 210, 220, 230 and 240 may alternatively use sputtering, pulsed lasers, and/or another similar technique to vaporize copper ions from the target 205.

As indicated above, FIGS. 2A-2E are provided as examples. Other examples may differ from what is described with regard to FIGS. 2A-2E. The number and arrangement of devices shown in FIGS. 2A-2E are provided as examples. In practice, there may be additional devices, fewer devices, different devices, or differently arranged devices than those shown in FIGS. 2A-2E. Furthermore, two or more devices shown in FIGS. 2A-2E may be implemented within a single device, or a single device shown in FIGS. 2A-2E may be implemented as multiple, distributed devices. Additionally, or alternatively, a set of devices (e.g., one or more devices) shown in FIGS. 2A-2E may perform one or more functions described as being performed by another set of devices shown in FIGS. 2A-2E.

Figure 3:
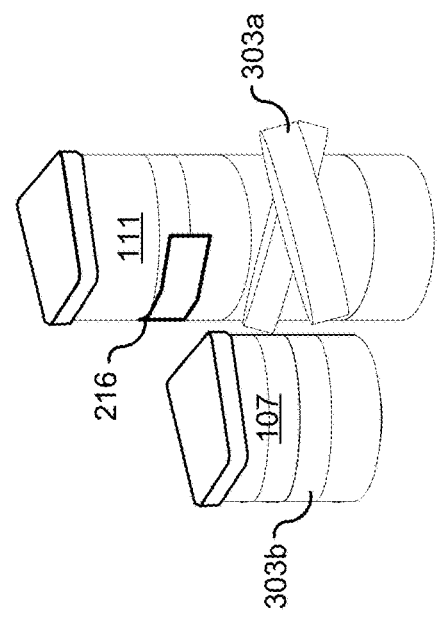
FIGS. 3-4 are diagrams of an example implementation described herein.

FIG. 3 is a diagram of an example 300 of a magnetic shield used with a deposition chamber in a semiconductor processing environment (e.g., environment 100 of FIG. 1). As shown in FIG. 3, example 300 includes a magnetic shield 216 (e.g., magnetic shield 216) adjacent to a copper deposition chamber 111. Additionally, in example 300, the magnetic shield 216 is positioned between the copper deposition chamber 111 and a neighboring deposition chamber 107. These chambers are described in further detail in connection with FIGS. 1 and 2A-2E.

As described in connection with FIGS. 2A-2E, the copper deposition chamber 111 may include one or more electromagnets 303*a* (e.g., electromagnets 207, 207*a*, 207*b*). Similarly, the neighboring deposition chamber 107 may include one or more electromagnets 303*b*. As a result, the neighboring deposition chamber 107 may generate EM noise. Accordingly, the magnetic shield 216 may redistribute magnetic flux throughout the material and insulate the copper deposition chamber 111 from the EM noise. Additionally, or alternatively, the neighboring deposition chamber 107 may include a motor and/or another electronic component that generates RF noise. The magnetic shield 216 may also absorb the RF signals and thus insulate the copper deposition chamber 111 from the RF noise. By insulating the copper deposition chamber 111 from EM and RF noise, uniformity of copper deposition on a wafer in the copper deposition chamber 111 is improved. Accordingly, MEOL and/or BEOL structures may be formed with fewer, if any, air gaps.

Additionally, the flow optimizer (or other collimator) and electromagnet(s) included in the copper deposition chamber 111 may direct more copper ions towards recesses on the wafer and fewer copper ions towards dielectric surfaces on the wafer with greater accuracy. As a result, a first layer of copper can be deposited on a first portion of the wafer that is thinner than at least a second layer of copper that is deposited on at least a second portion of the wafer. This allows for formation of MEOL and/or BEOL structures but with a relatively uniform final copper height on the wafer. For example, a variance associated with a height of the copper surface on the wafer after deposition may be reduced to a range from approximately 0.1% to approximately 2.5%. A variance of no more than 2.5% allows for copper to be removed via CMP with less dishing in the MEOL and/or BEOL structures and with less damage to the dielectric layer surrounding the MEOL and/or BEOL structures. Without the magnetic shield, a variance associated with a height of the copper surface on the wafer after deposition may be at least 5.0%.

In some implementations, the magnetic shield 216 is formed of at least one ferromagnetic material. For example, the magnetic shield 216 may be formed of a transition metal, such as nickel, iron, copper, chromium, molybdenum, vanadium, or manganese. In some implementations, the magnetic shield 216 may be an alloy of at least two transition metals.

The magnetic shield 216 may have a thickness in a range from approximately 0.1 mm to approximately 10 mm. By selecting a thickness of at least 0.1 mm, the magnetic shield 216 provides insulation against EM and RF noise. By selecting a thickness of no more than 10 mm, raw materials are not consumed to manufacture the magnetic shield 216 with little to no increase in how efficiently the magnetic shield 216 insulates against EM and RF noise.

When the deposition chamber 107 is associated with a power consumption from approximately 1000 Watts (W) to approximately 2000 W, a lower end of a range for thickness of the magnetic shield 216 may be selected as approximately 0.1 mm. Similarly, when the deposition chamber 107 is at a distance from the copper deposition chamber 111 in a range from approximately 80 centimeters (cm) to approximately 120 cm, a lower end of a range for thickness of the magnetic shield 216 may be selected as approximately 0.1 mm. On the other hand, when the deposition chamber 107 is associated with a power consumption greater than 2000 W and/or when the deposition chamber 107 is at a distance from the copper deposition chamber 111 less than 80 cm, a lower end of a range for thickness of the magnetic shield 216 may be selected as 0.2 mm. For example, a thickness in a range from approximately 0.1 mm to approximately 0.2 mm may be insufficient to insulate against EM and RF noise generated under the conditions described above.

In some implementations, the magnetic shield 216 may have a length in a range from approximately 30 cm to approximately 150 cm. By selecting a length of at least 30 cm, the magnetic shield 216 provides insulation against EM and RF noise. By selecting a length of no more than 150 cm, raw materials are not consumed to manufacture the magnetic shield 216 with little to no increase in how efficiently the magnetic shield 216 insulates against EM and RF noise. In some implementations, an upper end for a range of the length of the magnetic shield 216 may correspond to a length of the copper deposition chamber 111. For example, the magnetic shield 216 may be formed no larger than a circumference (or other perimeter) of the copper deposition chamber 111. In some implementations, to allow the magnetic shield 216 to be moved adjacent to different portions of the copper deposition chamber 111 (e.g., as described in connection with FIG. 4), the magnetic shield 216 may be formed no larger than half of a circumference (or other perimeter) of the copper deposition chamber 111.

In some implementations, the magnetic shield 216 may have a width in a range from approximately 10 cm to approximately 50 cm. By selecting a width of at least 10 cm, the magnetic shield 216 provides insulation against EM and RF noise. By selecting a width of no more than 50 cm, raw materials are not consumed to manufacture the magnetic shield 216 with little to no increase in how efficiently the magnetic shield 216 insulates against EM and RF noise. In some implementations, an upper end for a range of the width of the magnetic shield 216 may correspond to a height of the copper deposition chamber 111. For example, the magnetic shield 216 may be formed no larger than a height of the copper deposition chamber 111. In some implementations, to allow the magnetic shield 216 to be moved adjacent to different portions of the copper deposition chamber 111 (e.g., as described in connection with FIG. 4), the magnetic shield 216 may be formed no larger than half of a height of the copper deposition chamber 111.

In some implementations, as shown in FIG. 3, the magnetic shield 216 may surround a portion of the copper deposition chamber 111. As a result, fewer materials are used to manufacture the magnetic shield 216, and the magnetic shield 216 may be moved to different positions adjacent to the copper deposition chamber 111 during different deposition processes (e.g., as described in connection with FIG. 4). As an alternative, the magnetic shield 216 may be dimensioned to surround all of the copper deposition chamber 111. As a result, the magnetic shield 216 insulates the copper deposition chamber 111 from a maximal amount of EM and RF noise coming from any direction.

As indicated above, FIG. 3 is provided as an example. Other examples may differ from what is described with regard to FIG. 3.

Figure 4:
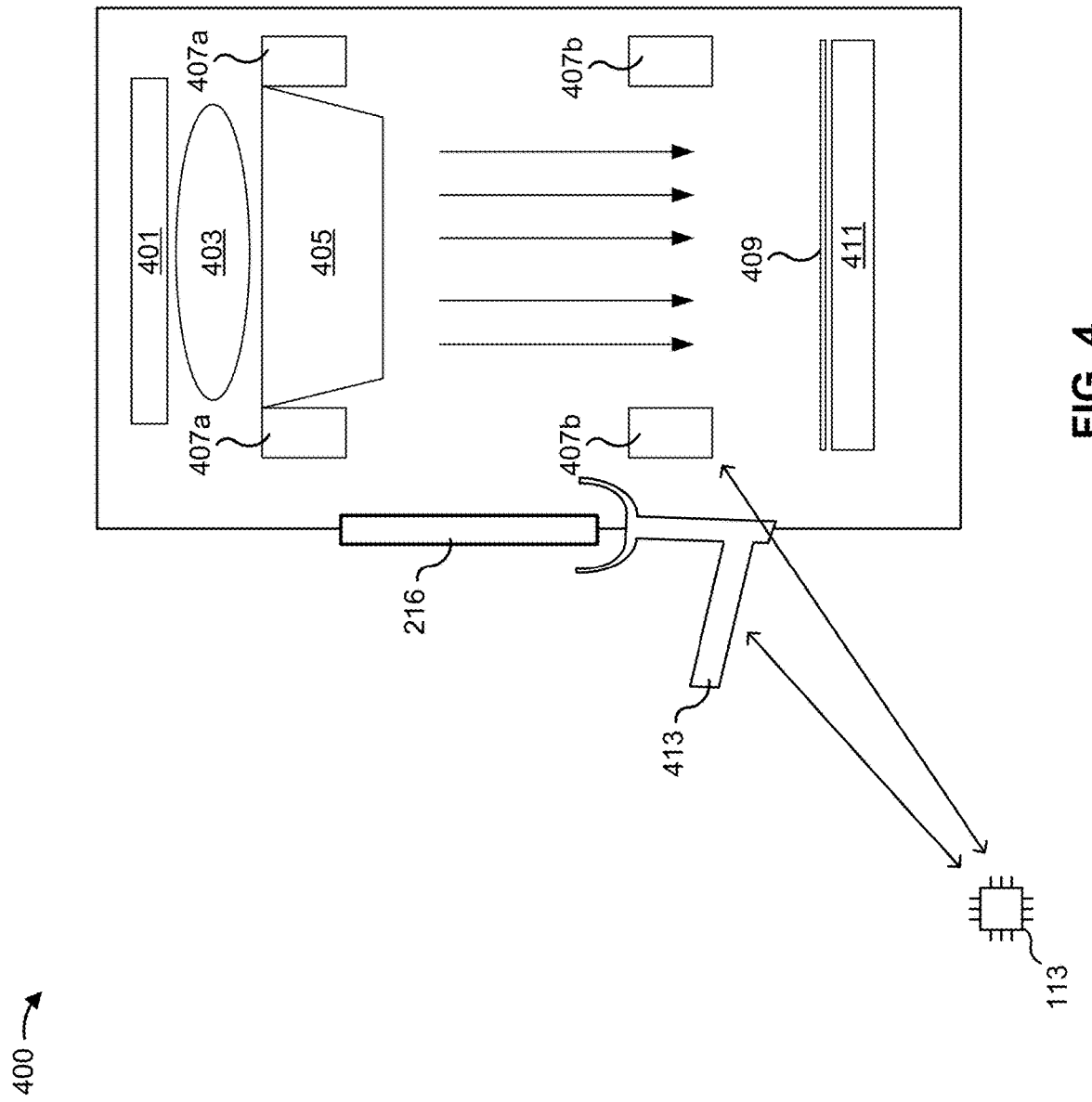

FIG. 4 is a diagram of an example 400 of a copper deposition chamber within a semiconductor processing environment (e.g., environment 100 of FIG. 1). For example, the copper deposition chamber shown in FIG. 4 may be included in environment 100 (e.g., as copper deposition chamber 111a and/or copper deposition chamber 111b).

Example 400 is similar to example 240 of FIG. 2E. As shown in FIG. 4, example 400 includes a target 403 on a base 401. Copper ions are vaporized from target 403 and directed from the target 403 to a wafer 409, on a wafer stage 411, using a flow optimizer 405, an upper electromagnet 407a, and a lower electromagnet 407b. Additionally, in some implementations, the wafer 409 is heated using a lamp component and/or a heating element included in the wafer stage 411.

As shown in FIG. 4, a magnetic shield 216 may be positioned adjacent to a portion of the copper deposition chamber. For example, the magnetic shield 216 may be positioned adjacent to the copper deposition chamber using a transport mechanism (e.g., as described below) and/or may be attached (e.g., using an adhesive and/or fastener components, such as screws or nails) to the copper deposition chamber. In some implementations, the magnetic shield 216 may be positioned adjacent to a first portion of the copper deposition chamber associated with deposition of a first layer of copper that is thinner than a second layer of copper associated with at least a second portion of the copper deposition chamber. For example, the first portion of the copper deposition chamber may include a first portion of the wafer 409 on which shorter MEOL and/or BEOL structures are deposited as compared with MEOL and/or BEOL structures that are deposited on a second portion of the wafer 409 that is located in the second portion of the copper deposition chamber.

Additionally, even when hardware failure occurs during PVD (e.g., electromagnet 407a and/or electromagnet 407b malfunctions, wafer stage 411 is not level, and/or flow optimizer 405 induces too much shift, among other examples), the copper atoms are less susceptible to small re-directions from external noise. As a result, BEOL and/or MEOL conductive structures are formed on the wafer 409 in a more uniform manner, which increases conductivity and improves lifetime of an electronic device including the BEOL and/or MEOL conductive structures.

In some implementations, controller 113 (e.g., as described in connection with FIG. 1) may determine the first portion of the copper deposition chamber (e.g., based on the first portion of the wafer 409) and the second portion of the copper deposition chamber (e.g., based on the second portion of the wafer 409). For example, the controller 113 may control the flow optimizer 405, the electromagnet 407a, and/or the electromagnet 407b such that the controller 113 has access to a file (or other data structure) indicating a schematic associated with the wafer 409. Alternatively, the controller 113 may receive the file from a different device that controls the flow optimizer 405, the electromagnet 407a, and/or the electromagnet 407b. In some implementations, the schematic may indicate thicknesses of copper deposition for different portions of the wafer 409. As an alternative, the schematic may indicate locations of desired MEOL and/or BEOL structures on the wafer 409 such that the controller 113 may estimate thicknesses of copper deposition for different portions of the wafer 409. Based on the thicknesses of copper deposition for different portions of the wafer 409, the controller 113 may determine the first portion of the wafer 409 (and thus the first portion of the copper deposition chamber) adjacent to which the magnetic shield 216 should be positioned.

Additionally, or alternatively, the controller 113 may simulate a PVD process for depositing copper according to one or more parameters associated with the wafer 409. For example, the controller 113 may receive data indicating a length of time, a setting associated with a rate of vaporization from the target 403, a setting associated with the flow optimizer 405, and/or settings associated with the electromagnet 407a and/or the electromagnet 407b such that the controller 113 simulates which portions of the wafer 409 are likely to receive more copper than other portions. For example, the controller 113 may execute a model for movement of copper ions from the target 403 to the wafer 409 based on inputs described above. Based on the simulated copper deposition for different portions of the wafer 409, the controller 113 may determine the first portion of the wafer 409 (and thus the first portion of the copper deposition chamber) adjacent to which the magnetic shield 216 should be positioned.

In some implementations, the controller 113 is configured to use a machine learning model, which is trained based on historical data, to control positioning of the magnetic shield 216. For example, the machine learning model may correlate historical deposition profiles on wafers (e.g., topographic maps of copper thickness) with historical inputs associated with copper deposition processes (e.g., as described above). Other parameters used by the model may include make/model information associated with the flow optimizer 405 and/or the electromagnets 407, shapes associated with slots of the flow optimizer 405, locations of the electromagnets 407, power applied to the electromagnets 407, ages of the flow optimizer 405, the electromagnets 407, and/or other components of the copper deposition chamber, an amount of time associated with a most recent cleaning of the copper deposition chamber, types of structures to be formed on wafers, and/or deposition parameters (e.g., temperature of the target 403, temperature of wafers, pressure, and/or other parameters), among other examples. For a combination of historical inputs and/or parameters, the machine learning model may have been trained to estimate portions of the wafer 409 that are associated with thinner depositions of copper. For example, the machine learning model may have been trained until an associated loss function satisfied a training threshold. Accordingly, the machine learning model may accept data indicating the inputs associated with a copper deposition process and output data estimating a position for the magnetic shield 216 (e.g., adjacent to the estimated first portion of the wafer 409 associated with thinner copper deposition).

In some implementations, the controller 113 may output data indicating a position for the magnetic shield 216 based on the first portion of the copper deposition chamber and the second portion of the copper deposition chamber. For example, the controller 113 may output a decimal representation of coordinates for a center of the magnetic shield 216 (e.g., relative to an origin associated with the copper deposition chamber). Additionally, or alternatively, the controller 113 may transmit a command to a transport mechanism 413 to move the magnetic shield 216 to the position determined by the controller 113. As shown in FIG. 4, the transport mechanism 413 may include a robotic arm that moves the magnetic shield 216. Other examples for the transport mechanism 413 may include a gripping device that moves along a track (e.g., on a floor of an environment including the copper deposition chamber or on a ceiling of an environment including the copper deposition chamber) or a hoisting device that moves along a track (e.g., on a ceiling of an environment including the copper deposition chamber).

The magnetic shield 216 may be attached to the copper deposition chamber (e.g., using an adhesive and/or fastener components, such as screws or nails) after the transport mechanism 413 moves the magnetic shield 216 to the position determined by the controller 113. Alternatively, the transport mechanism 413 may hold the magnetic shield 216 in the position determined by the controller 113 while the copper deposition chamber is in use.

In some implementations, the controller 113 may additionally or alternatively output data indicating which magnetic shield 216, of a plurality of magnetic shields, to use based on the first portion of the copper deposition chamber and the second portion of the copper deposition chamber. For example, the controller 113 may select a longer and/or wider magnetic shield 216 to use when the first portion of the copper deposition chamber is larger. Additionally, or alternatively, the controller 113 may select a thicker magnetic shield 216 to use when the first portion of the copper deposition chamber is larger. Additionally, or alternatively, the controller 113 may output data indicating which magnetic shield 216, of a plurality of magnetic shields, to use based on a power consumption associated with a neighboring deposition chamber and/or a distance between the copper deposition chamber and the neighboring deposition chamber. For example, the controller 113 may select a thicker magnetic shield 216 to use when the power consumption is larger and/or the distance is smaller. In some implementations, the controller 113 may transmit a command to the transport mechanism 413 to retrieve the selected magnetic shield 216 from a repository of the plurality of magnetic shields. The controller 113 may further transmit a command to move the selected magnetic shield 216 to the position determined by the controller 113.

In some implementations, the controller 113 may additionally control the flow optimizer 405, the electromagnet 407a, and/or the electromagnet 407b. Accordingly, the controller 113 may additionally transmit a command to the flow optimizer 405 and/or a command to the electromagnet 407a and/or the electromagnet 407b to direct more copper ions toward the second portion of the wafer 409 as compared with the first portion of the wafer 409.

As indicated above, FIG. 4 is provided as an example. Other examples may differ from what is described with regard to FIG. 4.

Figure 5:
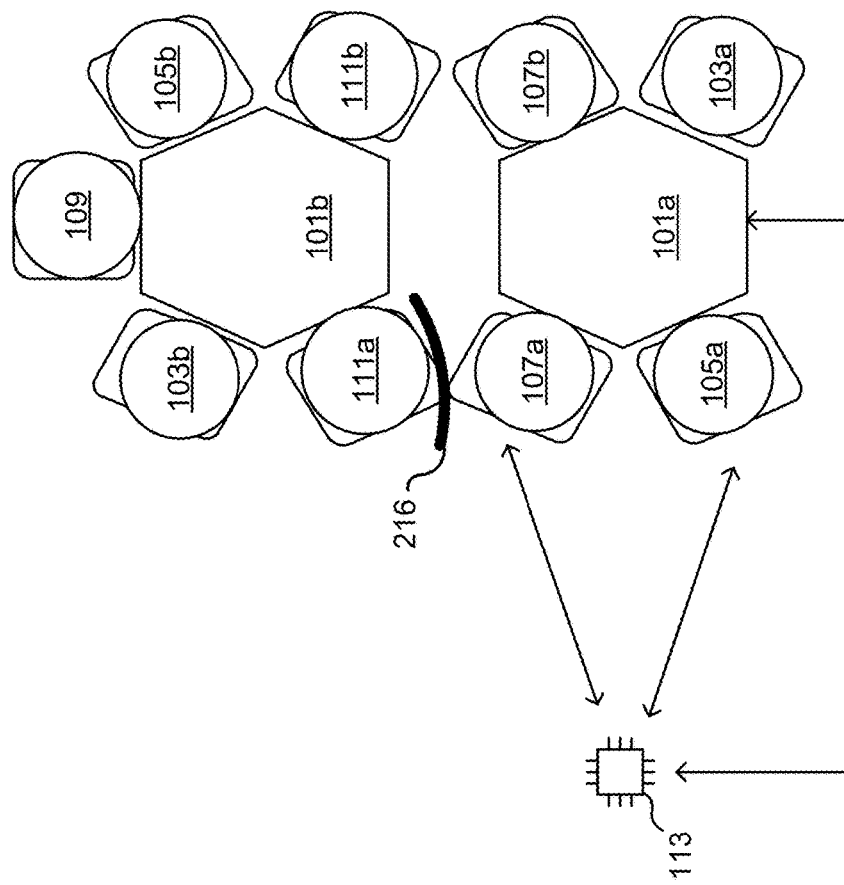
FIG. 5 is a diagram of an example implementation for use in the semiconductor processing tool of FIG. 1.

FIG. 5 is a diagram of an example of a semiconductor processing environment 500 described herein. The semiconductor processing environment 500 may be configured for use in a semiconductor foundry or a semiconductor fabrication facility, among other examples.

Environment 500 is similar to environment 100 but includes a magnetic shield 216 between the copper deposition chamber 111a and the deposition chamber 107a. As a result, the magnetic shield 216 insulates the copper deposition chamber 111a from EM and RF noise, which improves uniformity of copper deposition on a wafer in the copper deposition chamber 111a. Although shown with respect to copper deposition chamber 111a, a magnetic shield may additionally or alternatively be installed adjacent to the copper deposition chamber 111b (e.g., between the copper deposition chamber 111b and the deposition chamber 107b).

In some implementations, as shown in FIG. 5, the magnetic shield 216 is positioned adjacent to a portion of the copper deposition chamber 111a. For example, the position between the copper deposition chamber 111a and the deposition chamber 107a may be selected as described above in connection with FIG. 4.

As indicated above, FIG. 5 is provided as an example. Other examples may differ from what is described with regard to FIG. 5.

FIGS. 6A-6E are diagrams of an example implementation 600 described herein. Example implementation 600 may be an example process for copper deposition using the copper deposition chamber described herein. The copper deposition chamber causes a conductive structure 622 to be formed in a more uniform manner, which increases conductivity and improves lifetime of an electronic device including the conductive structure 622.

As shown in FIG. 6A, the example process for forming the conductive structure 614 may be performed in connection with an MEOL or a BEOL. In some implementations, the MEOL or the BEOL includes a conductive structure 614 (e.g., an interconnect or contact plug of the MEOL; a via layer of the BEOL, such as a V0 via layer; and/or a metallization layer of the BEOL, such as an M0 metallization layer, an M1 metallization layer, or an Mx metallization layer, where x represents a positive integer). Additionally, the MEOL and/or the BEOL includes one or more stacked layers on a substrate, including an etch stop layer (ESL) 602, a dielectric layer 604, an ESL 606, a dielectric layer 608, an ESL 610, and a dielectric layer 612, among other examples. The dielectric layers 604, 608, and 612 are included to electrically isolate various structures in the MEOL and/or the BEOL. The dielectric layers 604, 608, and 612 may each include a silicon nitride ($SiN_x$), an oxide (e.g., a silicon oxide ($SiO_x$) and/or another oxide material), and/or another type of dielectric material. The ESLs 602, 606, and 610 may each include a layer of material that is configured to permit various portions of the MEOL and/or the BEOL to be selectively etched or protected from etching to form one or more of the structures included in the MEOL and/or the BEOL. Although shown as single layers, in some implementations, the ESL 602, the ESL 606, and/or the ESL 610 include a plurality of ESL layers stacked together to function as an etch stop.

As further shown in FIG. 6A, the dielectric layers 608 and 612 may be etched to form an opening (resulting in recess 616). The recess 616 may be etched such that the conductive structure 614 is at least partially exposed. For example, a deposition tool may form a photoresist layer on the dielectric layer 612 (or on an ESL formed on the dielectric layer 612), an exposure tool may expose the photoresist layer to a radiation source to pattern the photoresist layer, a developer tool may develop and remove portions of the photoresist layer to expose the pattern, and an etch tool may etch portions of the dielectric layers 612 and 608 to form the recess 616. In some implementations, a photoresist removal tool removes the remaining portions of the photoresist layer (e.g., using a chemical stripper, a plasma asher, and/or another technique) after the etch tool etches the recess 616.

Figure 6B:
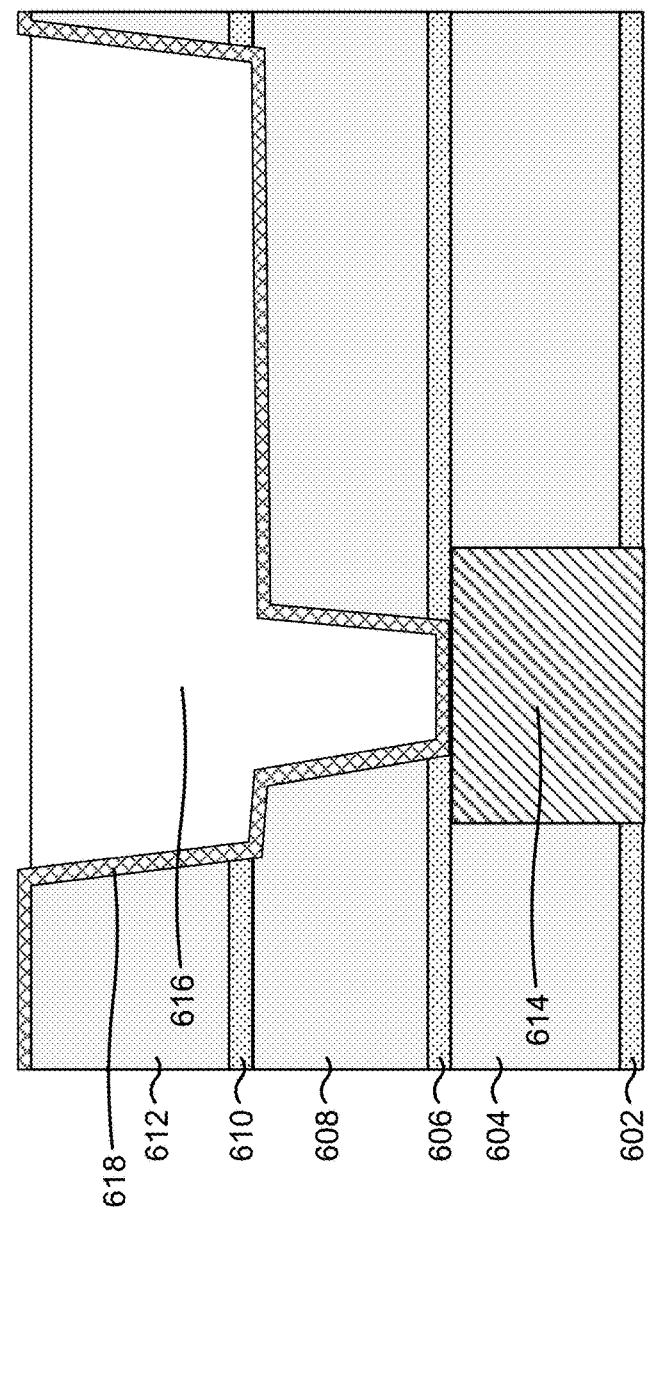

As shown in FIG. 6B, a barrier layer 618 may be formed on sidewalls of the recess 616 (and, in some implementations, over at least a portion of the dielectric layer 612). The deposition tool may deposit the barrier layer 618 by a CVD technique, a PVD technique, an ALD technique, or another type of deposition technique. A planarization tool may planarize at least a portion of the barrier layer 618 after the barrier layer 618 is deposited. Although shown as covering a bottom portion of the recess 616 (and thus an exposed surface of the conductive structure 614), in some implementations, the deposition tool may deposit a blocking material on the exposed surface of the conductive structure 614 to prevent, or at least slow, deposition of the barrier layer 618 on the bottom portion of the recess 616.

Figure 6C:
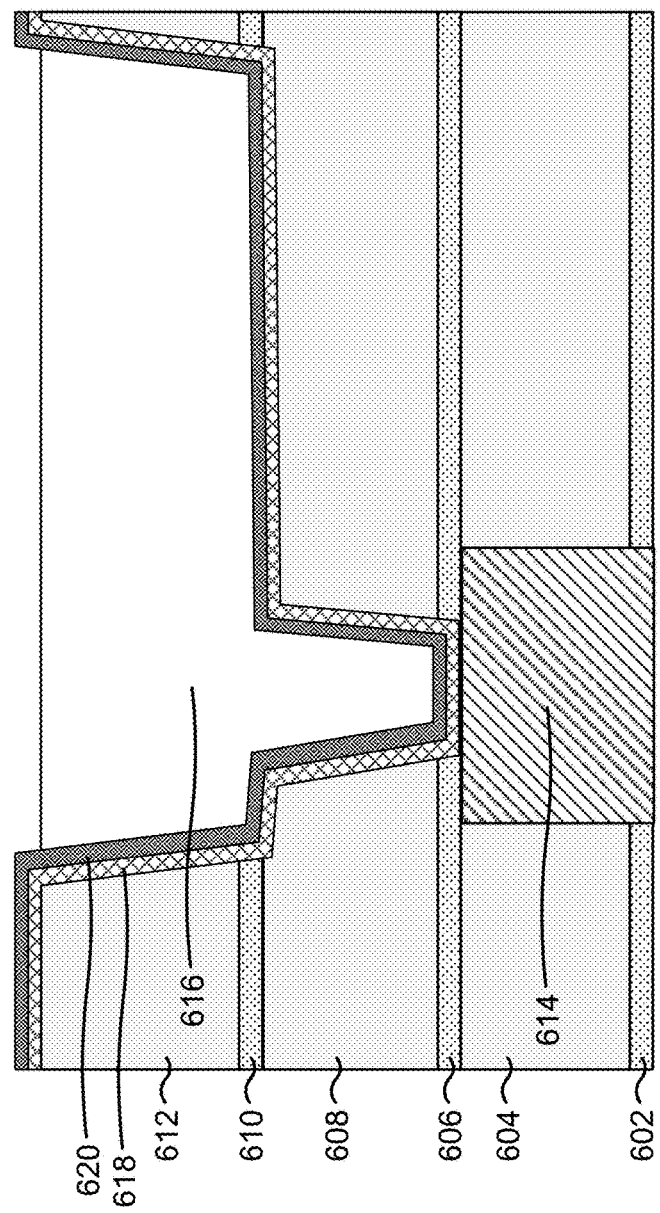

As shown in FIG. 6C, a liner layer 620 may be formed on sidewalls of the recess 616 (and, in some implementations, over at least a portion of the dielectric layer 612). The deposition tool may deposit the liner layer 620 by a CVD technique, a PVD technique, an ALD technique, or another type of deposition technique. A planarization tool may planarize at least a portion of the liner layer 620 after the liner layer 620 is deposited. In some implementations, the etch tool may remove the blocking material from the exposed surface of the conductive structure 614 such that the liner layer 620 is deposited on the bottom portion of the recess 616.

Figure 6D:
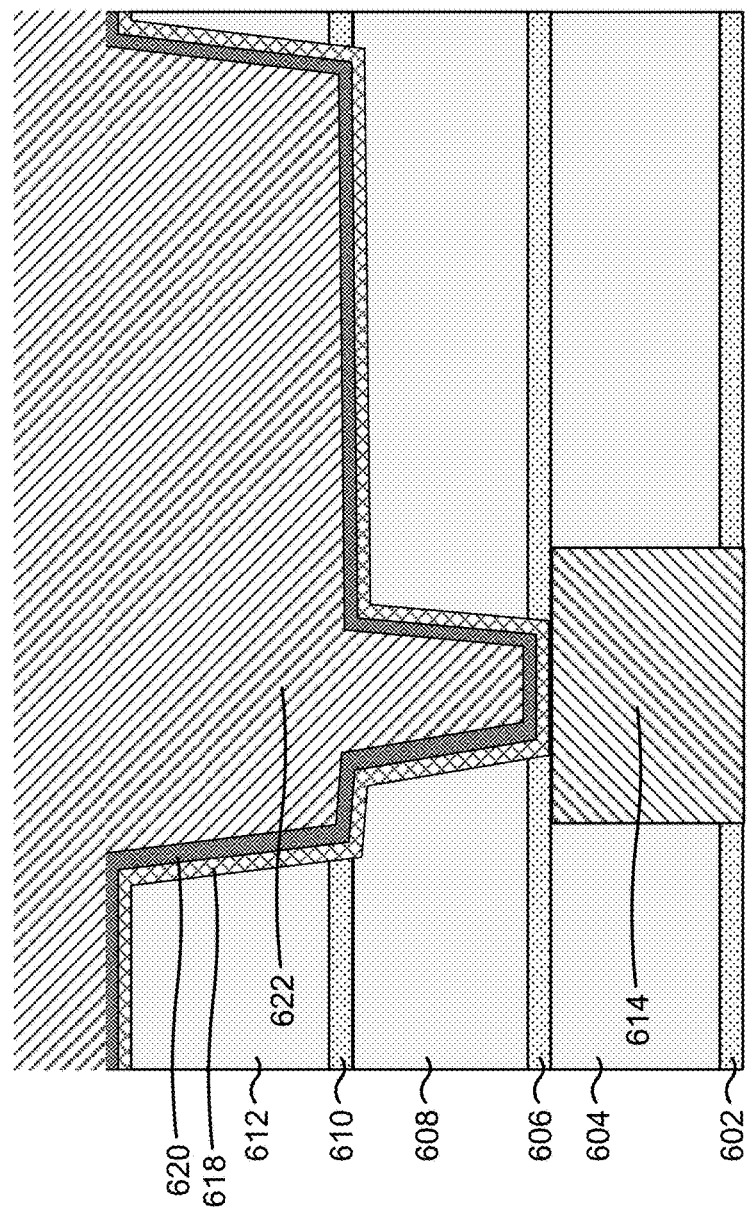

As shown in FIG. 6D, the conductive structure 622 may be formed in the recess 616. The conductive structure 622 may be formed of copper. Accordingly, the deposition tool may deposit the copper using a copper deposition chamber as described herein. The planarization tool may planarize the conductive structure 622 after deposition.

Figure 6E:
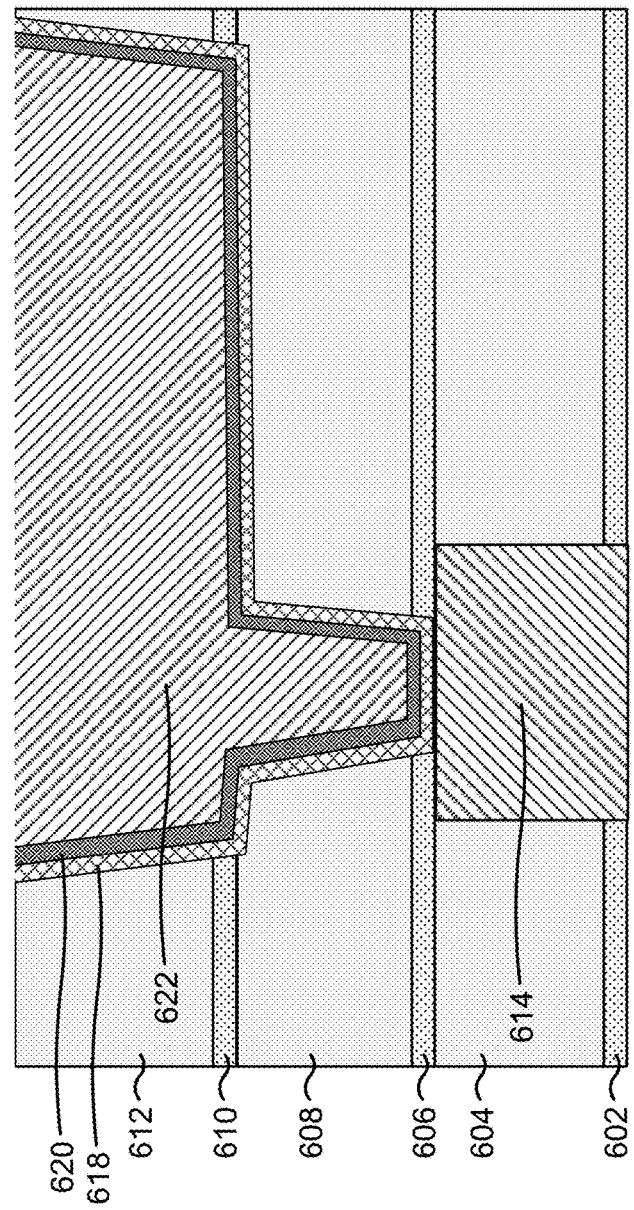

As shown in FIG. 6E, excess material on the dielectric layer 612 may be removed by chemical mechanical polishing (CMP). For example, the etch tool and/or the planarization tool may perform CMP to remove excess copper, barrier material, and/or liner material.

As indicated above, FIGS. 6A-6E are provided as an example. Other examples may differ from what is described with regard to FIGS. 6A-6E.

Figure 7:
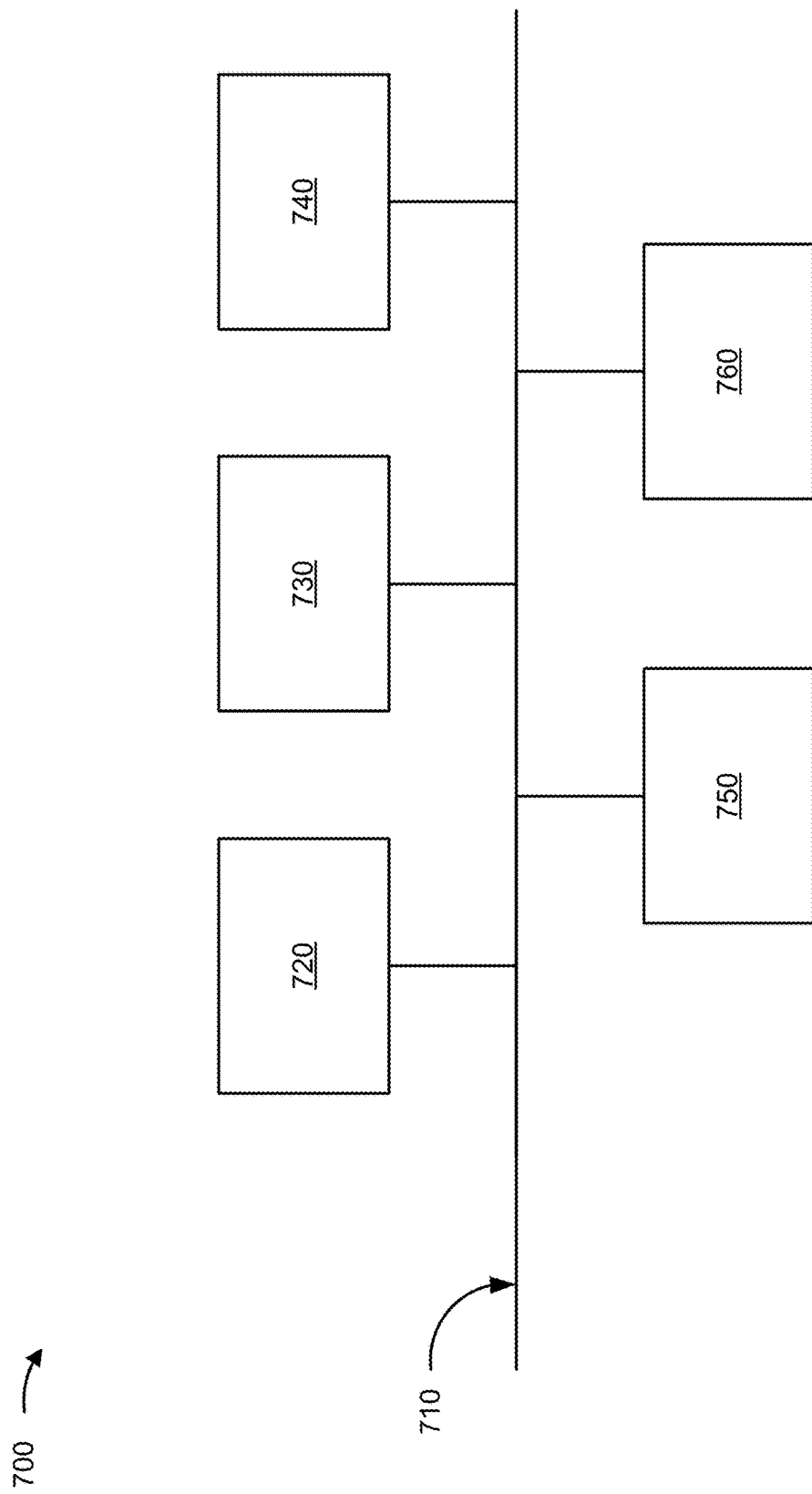
FIG. 7 is a diagram of example components of one or more devices of FIG. 1 described herein.

FIG. 7 is a diagram of example components of a device 700, which may correspond to a controller (e.g., controller 113) and/or a transport mechanism (e.g., transport mechanism 413). In some implementations, a controller and/or a transport mechanism include one or more devices 700 and/or one or more components of device 700. As shown in FIG. 7, device 700 may include a bus 710, a processor 720, a memory 730, an input component 740, an output component 750, and a communication component 760.

Bus 710 includes one or more components that enable wired and/or wireless communication among the components of device 700. Bus 710 may couple together two or more components of FIG. 7, such as via operative coupling, communicative coupling, electronic coupling, and/or electric coupling. Processor 720 includes a central processing unit, a graphics processing unit, a microprocessor, a controller, a microcontroller, a digital signal processor, a field-programmable gate array, an application-specific integrated circuit, and/or another type of processing component. Processor 720 is implemented in hardware, firmware, or a combination of hardware and software. In some implementations, processor 720 includes one or more processors capable of being programmed to perform one or more operations or processes described elsewhere herein.

Memory 730 includes volatile and/or nonvolatile memory. For example, memory 730 may include random access memory (RAM), read only memory (ROM), a hard disk drive, and/or another type of memory (e.g., a flash memory, a magnetic memory, and/or an optical memory). Memory 730 may include internal memory (e.g., RAM, ROM, or a hard disk drive) and/or removable memory (e.g., removable via a universal serial bus connection). Memory 730 may be a non-transitory computer-readable medium. Memory 730 stores information, instructions, and/or software (e.g., one or more software applications) related to the operation of device 700. In some implementations, memory 730 includes one or more memories that are coupled to one or more processors (e.g., processor 720), such as via bus 710.

Input component 740 enables device 700 to receive input, such as user input and/or sensed input. For example, input component 740 may include a touch screen, a keyboard, a keypad, a mouse, a button, a microphone, a switch, a sensor, a global positioning system sensor, an accelerometer, a gyroscope, and/or an actuator. Output component 750 enables device 700 to provide output, such as via a display, a speaker, and/or a light-emitting diode. Communication component 760 enables device 700 to communicate with other devices via a wired connection and/or a wireless connection. For example, communication component 760 may include a receiver, a transmitter, a transceiver, a modem, a network interface card, and/or an antenna.

Device 700 may perform one or more operations or processes described herein. For example, a non-transitory computer-readable medium (e.g., memory 730) may store a set of instructions (e.g., one or more instructions or code) for execution by processor 720. Processor 720 may execute the set of instructions to perform one or more operations or processes described herein. In some implementations, execution of the set of instructions, by one or more processors 720, causes the one or more processors 720 and/or the device 700 to perform one or more operations or processes described herein. In some implementations, hardwired circuitry is used instead of or in combination with the instructions to perform one or more operations or processes described herein. Additionally, or alternatively, processor 720 may be configured to perform one or more operations or processes described herein. Thus, implementations described herein are not limited to any specific combination of hardware circuitry and software.

The number and arrangement of components shown in FIG. 7 are provided as an example. Device 700 may include additional components, fewer components, different components, or differently arranged components than those shown in FIG. 7. Additionally, or alternatively, a set of components (e.g., one or more components) of device 700 may perform one or more functions described as being performed by another set of components of device 700.

Figure 8:
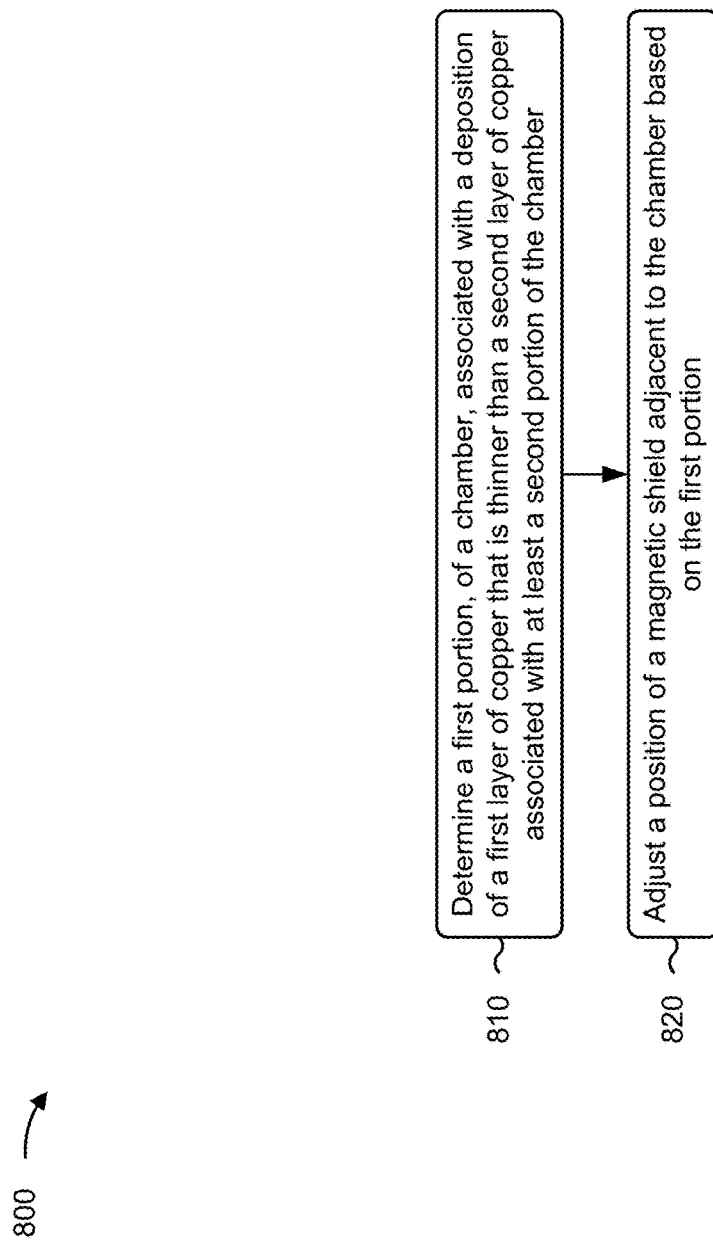
FIG. 8 is a flowchart of an example process associated with using a magnetic shield for copper deposition.

FIG. 8 is a flowchart of an example process 800 associated with using a magnetic shield for copper deposition. In some implementations, one or more process blocks of FIG. 8 are performed by a system (e.g., a deposition system, such as environment 100 of FIG. 1). In some implementations, one or more process blocks of FIG. 8 are performed by another device or a group of devices separate from or including the system, such as a controller (e.g., controller 113) and/or a transport mechanism (e.g., transport mechanism 413). Additionally, or alternatively, one or more process blocks of FIG. 8 may be performed by one or more components of device 700, such as processor 720, memory 730, input component 740, output component 50, and/or communication component 760.

As shown in FIG. 8, process 800 may include determining a first portion, of a chamber, associated with a deposition of a first layer of copper that is thinner than a second layer of copper associated with at least a second portion of the chamber (block 810). For example, the controller 113 may determine a first portion, of a chamber 111, associated with a deposition of a first layer of copper that is thinner than a second layer of copper associated with at least a second portion of the chamber 111, as described herein.

As further shown in FIG. 8, process 800 may include transmitting a command to position a magnetic shield adjacent to the chamber based on the first portion (block 820). For example, the controller 113 may transmit a command (e.g., to transport mechanism 413) to position of a magnetic shield 216 adjacent to the chamber 111 based on the first portion, as described herein.

Process 800 may include additional implementations, such as any single implementation or any combination of implementations described below and/or in connection with one or more other processes described elsewhere herein.

In a first implementation, adjusting the position includes selecting a position adjacent to an upper electromagnet 407*a* of the chamber 111 and adjacent to the first portion.

In a second implementation, alone or in combination with the first implementation, transmitting the command includes selecting a position between an upper electromagnet 407*a* of the chamber 111 and a lower electromagnet 407*b* of the chamber 111 and adjacent to the first portion.

In a third implementation, alone or in combination with one or more of the first and second implementations, transmitting the command includes transmitting a command to a transport mechanism 413 to move the magnetic shield 216 to the position from a previous position.

In a fourth implementation, alone or in combination with one or more of the first through third implementations, process 800 further includes transmitting an instruction to at least one flow optimizer 405, associated with the chamber 111, to direct copper ions towards the second portion.

In a fifth implementation, alone or in combination with one or more of the first through fourth implementations, process 800 further includes transmitting an instruction to at least one electromagnet 407*a*/407*b*, associated with the chamber 111, to direct copper ions towards the second portion.

In a sixth implementation, alone or in combination with one or more of the first through fifth implementations, determining the first portion includes simulating the deposition on a wafer 409 to estimate the first portion and the second portion.

In a seventh implementation, alone or in combination with one or more of the first through sixth implementations, determining the first portion includes inputting, to a machine learning model, one or more parameters associated with the deposition to determine the first portion.

Although FIG. 8 shows example blocks of process 800, in some implementations, process 800 includes additional blocks, fewer blocks, different blocks, or differently arranged blocks than those depicted in FIG. 8. Additionally, or alternatively, two or more of the blocks of process 800 may be performed in parallel.

In this way, a magnetic shield reduces external noise in a chamber including a target and at least one electromagnet for copper PVD. The shield may have a thickness in a range from approximately 0.1 mm to approximately 10 mm to provide sufficient protection from RF and other EM signals. As a result, copper atoms in the chamber undergo less re-direction from external noise. Additionally, even when hardware failure occurs during PVD (e.g., an electromagnet malfunctions, a wafer stage is not level, and/or a flow optimizer induces too much shift, among other examples), the copper atoms are less susceptible to small re-directions from external noise. As a result, BEOL and/or MEOL conductive structures are formed in a more uniform manner, which increases conductivity and improves lifetime of an electronic device including the BEOL and/or MEOL conductive structures.

As described in greater detail above, some implementations described herein provide a device. The device includes a chamber with at least one electromagnet and at least one flow optimizer that are configured to direct copper ions from a copper target onto a wafer. The device further includes a magnetic shield adjacent to the chamber and configured to reduce electromagnetic noise within the chamber.

As described in greater detail above, some implementations described herein provide a method. The method includes determining a first portion, of a chamber, associated with a deposition of a first layer of copper that is thinner than a second layer of copper associated with at least a second portion of the chamber. The method further includes adjusting a position of a magnetic shield adjacent to the chamber based on the first portion.

As described in greater detail above, some implementations described herein provide a system. The system includes at least one flow optimizer configured to direct copper ions from a copper target towards a wafer and at least one electromagnet configured to further direct the copper ions to the wafer. The system further includes a magnetic shield configured to reduce electromagnetic noise external to the at least one flow optimizer and the at least one electromagnet. The system additionally includes at least one processor configured to determine a position of the magnetic shield based on a first portion, of the wafer, associated with a deposition of a first layer of copper that is thinner than a second layer of copper deposited on at least a second portion of the wafer.

As used herein, "satisfying a threshold" may, depending on the context, refer to a value being greater than the threshold, greater than or equal to the threshold, less than the threshold, less than or equal to the threshold, equal to the threshold, not equal to the threshold, or the like.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
   a chamber including at least one electromagnet and at least one flow optimizer that are configured to direct copper ions from a copper target onto a wafer;
   a magnetic shield adjacent to the chamber and configured to reduce electromagnetic noise within the chamber; and a transport mechanism configured to move the magnetic shield from a first position adjacent to the chamber to a second position adjacent to the chamber based on a command from a processor, wherein the second position is based on a desired thickness of a deposition of a first layer of copper associated with a first portion of the wafer.

2. The device of claim 1, wherein the magnetic shield comprises an alloy of transition metals selected from nickel, iron, copper, chromium, molybdenum, vanadium, or manganese.

3. The device of claim 1, wherein the magnetic shield has a thickness in a range from approximately 0.1 millimeters (mm) to approximately 10 mm.

4. The device of claim 1, wherein the magnetic shield has a length in a range from approximately 30 centimeters (cm) to approximately 150 cm.

5. The device of claim 1, wherein the magnetic shield has a width in a range from approximately 10 centimeters (cm) to approximately 50 cm.

6. The device of claim 1, wherein the at least one electromagnet includes an upper electromagnet, and the magnetic shield is positioned adjacent to the upper electromagnet.

7. A system, comprising:
at least one flow optimizer configured to direct copper ions from a copper target towards a wafer;
at least one electromagnet configured to further direct the copper ions to the wafer;
a magnetic shield configured to reduce electromagnetic noise external to the at least one flow optimizer and the at least one electromagnet; and
a transport mechanism configured to move the magnetic shield from a first position adjacent to a chamber, associated with the wafer, to a second position adjacent to the chamber based on a command from at least one processor, wherein the second position is based on a desired thickness of a deposition of a first layer of copper associated with a first portion of the wafer.

8. The system of claim 7, wherein the at least one electromagnet comprises at least an upper electromagnet that surrounds the chamber and a lower electromagnet that surrounds the chamber.

9. The system of claim 8, wherein the magnetic shield is positioned between the upper electromagnet and the lower electromagnet.

10. The system of claim 7, wherein the first portion of the wafer is based on a schematic associated with the wafer.

11. The system of claim 7, wherein the first portion of the wafer is based on a simulation of copper deposition on the wafer.

12. The system of claim 7, wherein the at least one flow optimizer comprises a collimator configured to distribute the copper ions from the copper target and direct the copper ions towards the wafer.

13. A system, comprising:
at least one flow optimizer configured to direct copper ions towards a wafer;
at least one electromagnet configured to further direct the copper ions to the wafer;
a magnetic shield configured to reduce electromagnetic noise; and
a transport mechanism configured to move the magnetic shield from a first position adjacent to a chamber, associated with the wafer, to a second position adjacent to the chamber, wherein the second position is based on a desired thickness of a deposition of a first layer of copper associated with a first portion of the wafer.

14. The system of claim 13, wherein the at least one electromagnet comprises at least an upper electromagnet that surrounds the chamber and a lower electromagnet that surrounds the chamber.

15. The system of claim 14, wherein the magnetic shield is positioned between the upper electromagnet and the lower electromagnet.

16. The system of claim 13, wherein the first layer of copper is thinner than a second layer of copper deposited on at least a second portion of the wafer.

17. The system of claim 13, further comprising at least one processor, wherein the at least one processor is further configured to transmit an instruction to the transport mechanism to move the magnetic shield.

18. The system of claim 17, wherein the at least one processor is further configured to:
transmit the instruction to the transport mechanism to position the magnetic shield based on the first portion being associated with a thinner deposition of copper than a second portion of the wafer.

19. The system of claim 18, wherein the at least one processor is further configured to:
input, to a machine learning model, one or more parameters associated with the deposition, wherein the first portion of the wafer is output from the machine learning model.

20. The system of claim 18, wherein the first portion of the wafer using is based on at least one of a schematic associated with the wafer or a simulation of copper deposition on the wafer.

* * * * *